Nov. 18, 1969 L. A. STANCHI 3,479,526

ELECTRICAL DISCRIMINATOR UNIT

Filed Aug. 22, 1966

INVENTOR

LUCIANO A. STANCHI 3,479,526

ELECTRICAL DISCRIMINATOR UNIT

Luciano A. Stanchi, Gavirate, Italy, assignor to European Atomic Energy Community (Euratom), Brussels, Belgium Filed Aug. 22, 1966, Ser. No. 574,001
Claims priority, application Germany, June 9, 1966, E 31,825
Int. Cl. H03k 5/20
U.S. Cl. 307—235 5 Claims

ABSTRACT OF THE DISCLOSURE

A tunnel diode discriminator using the dynamic characteristic of a self-oscillating tunnel diode. The characteristic of the tunnel diode comprises three positive slopes. A bipolar discrimination is thus realized with only one tunnel diode.

The present invention relates to discriminator units comprising tunnel diodes.

Such discrimnators take advantage of the N-shaped tunnel-diode characteristic which contains a negative resistance portion between two positive resistance regions. They are normally current controlled, that means, the switch over the negative region is effected by a positive going current pulse of at least the amplitude of the peak current of the tunnel diode characteristic, such producing a voltage step across the tunnel diode. If the control current amplitude is lower than this peak current no switching takes place and consequently no voltage step is obtained across the tunnel diode.

It is an object of the invention to provide a discriminator, using a tunnel diode with voltage control at the input and a current step at the output. Another object of the invention is a discriminator unit which might be controlled with input pulses of both polarities, but using a single tunnel diode only.

Still another object of the invention is a discriminator unit of high switching rates, improved temperature behaviour, low weight and low power consumption.

According to the invention the discriminator unit comprises a tunnel diode, a DC-bias source and a signal voltage input both applied to a first of the tunnel diode poles, said tunnel diode being arranged in series with a resistor of low value such that internal oscillations in the giga-Hertz-region arrive, a low impedance output stage with low frequency pass filter characteristic in respect to the oscillations being applied to the second pole of the tunnel diode.

Preferably another low frequency pass filter is connected across the tunnel diode and the low value resistor. In a preferred embodiment of the invention the low value resistor in series with the tunnel diode is a fast nonlinear diode operated by the bias current in its conductive zone. The output stage is built in a specific realization of the invention from a relatively slow transistor which is not able to follow the internal oscillations of the tunnel diode.

The principal idea on which the invention is based is to utilize a dynamic tunnel diode characteristic which is deformed by internal oscillations. Since some time these oscillations are known and published for example in IEEE Transactions on Electronic Devices, June 1965, p. 373. But people searched to avoid till now—for switching operation—these oscillations of the order of 1–100 gHz. by using suitable circuitry in order to assure operation of the tunnel diode on its statical characteristic.

The features cited above and other items, advantages and objects of the invention will now be described in detail on the basis of two figures which show a circuit diagram of a preferred embodiment of the invention and a a diagram concerning the operation of this circuit, respectively.

Figure 1:
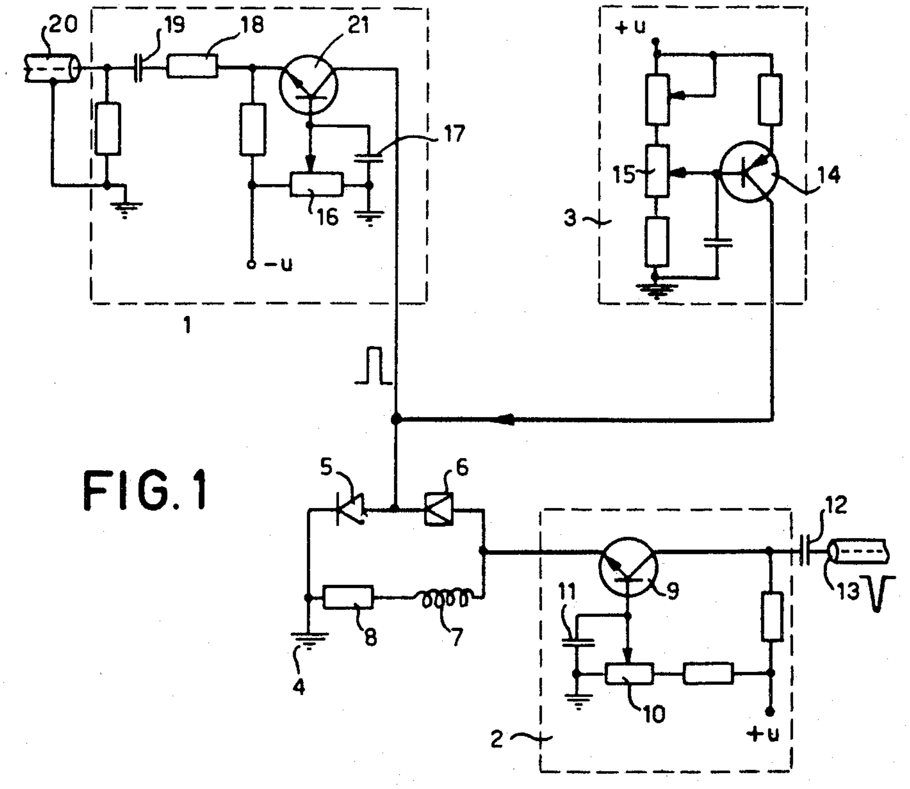

The discriminator circuit shown in FIG. 1 is composed of a signal input stage 1, a signal output stage 2, a DC-bias source unit 3 and the tunnel diode unit which connects all the other units. The tunnel diode unit contains between ground potential 4 and the signal output stage 2 a fast nonlinear diode 5, of the germanium type for instance, and a tunnel diode 6 in series connection. Across this series connection a low frequency pass filter is applied, composed of a inductive and an ohmic resistance 7, 8 in series.

The output stage 2 contains for the polarity shown a npn-transistor 9 which is base-biased over an adjustable resistance 10 and a capacitance 11. Its emitter is connected directly to the tunnel diode and its collector is connected via a DC blocking capacitor 12 to the signal output 13 of the discriminator.

The DC-bias source unit 3 contains a positive voltage source and a transistor 14 which is of pnp-type and furnishes constant current to the connecting point of the tunned diode and the diode. This current might be adjusted to a desired value by a potentiometer 15 which controls the voltage on the base electrode of transistor 14. The DC bias current flows in part through diode 5 and in part through tunnel diode 6 and the filter elements 7, 8 to ground 4.

The diode 5 is operated in its conductive zone and represents therefore a little resistance only. The DC-bias is adjusted to operate the tunnel diode 6 in the zone which is statically of negative resistance. But as the output stage (transistor 9) is not able to follow this high frequency of oscillation, the deformation of the statical characteristic due to the oscillations can be utilized as a true characteristic.

Figure 2:
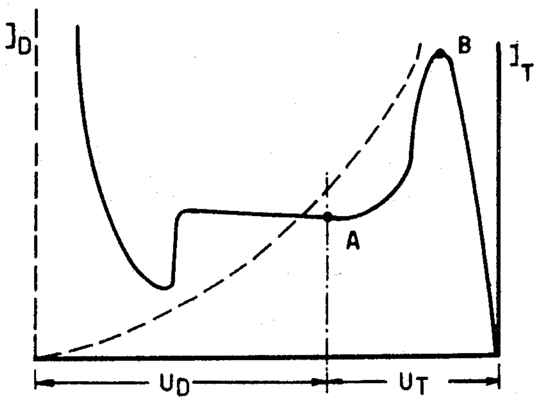

FIG. 2 shows this characteristic in a current/voltage diagram where the voltage increases from right to left (the dotted line must not be considered here). This characteristic contains two negative resistance portions between three positive resistance regions. The DC-bias current is adjusted as to stabilize the circuit in the central positive resistance region (point A).

The sum of voltages $U_D$ and $U_T$ across the diode 5 and tunnel diode 6 is kept practically constant by the output stage 2. If now an e.g. positive going voltage pulse from the signal input stage 1 is applied to the connection point of the diode 5 and tunnel diode 6 the voltage across the diode increases and that across the tunnel diode decreases. If the voltage pulse is high enough to pass over the peak point B of the characteristic a current pulse is produced in the tunnel diode which can be read out by the output stage 2.

A negative going input pulse produces of course a displacement of operation point A to the left and an output pulse of inversed polarity. FIG. 2 shows furthermore in dotted lines over the same voltage abscissa the diode current characteristic, which is plotted in opposition to the tunnel diode curve so that the working points on the two curves are obtained for the same abscissa.

The circuit description must still be completed by the details of the input stage which is quite classical: It contains a npn-transistor which is base-biased (bias voltage—U, resistance 16, blocking capacitor 17). Its emitter is connected via an impedance matching obtained by resistor 18 or a suitable transformer and via capacitor 19 to an input cable 20. It is provided e.g. to produce positive pulses which drive the tunnel diode to the peak point B. If only one polarity is needed preference is given to this one as it is highly stable against temperature steps whereas the tunnel diode curve displaces slightly with temperature in the left hand portion. This is an effect common to all tunnel diodes even in normal undeformed operation.

It is obvious that the discriminator described above can be easily adapted to different necessities: The discrimination threshold can be influenced by the potentiometer 15 in the DC-bias source unit and/or by variable resistor 16 in the signal input stage the value of which destinates the amplification rate of transistor 21. If both thresholds are utilized the potentiometer 15 controls the balance between them and resistor 16 their absolute value.

The invention is not limited to the specific realization of FIG. 1 especially concerning the auxiliary circuits 1, 2 and 3. In an experimental realization of the circuit of FIG. 1 output pulses of 70 mv. and 2 nsec. have been obtained.

What I claim is:

1. Electrical discriminator unit comprising a tunnel diode, a DC-bias source and a signal voltage input both applied to a first of the tunnel diode poles, said tunnel diode being arranged in series with a resistor of low value such that internal oscillations in the giga-Hz.-region arrive, a low impedance output stage with low frequency pass filter characteristic in respect to the oscillations being applied to the second pole of the tunnel diode.

2. Discriminator according to claim 1 in which a low frequency pass filter is connected across the tunnel diode and the low value resistor.

3. Discriminator according to claim 1 in which the low value resistor is a fast nonlinear diode operated by the bias current in its conductive zone.

4. Discriminator according to claim 1 in which the output stage is built from a relatively slow transistor which is base-biased.

5. Discriminator according to claim 1 in which the DC-bias-source is adjustable as to operate the tunnel diode in desired points of its characteristic, preferably in the region which statically has a negative shape.

References Cited

UNITED STATES PATENTS

| | | | |
|---|---|---|---|
| 3,328,607 | 6/1967 | Stromer | 307—235 X |
| 3,366,891 | 1/1968 | Macrander et al. | 307—322 X |
| 3,383,524 | 5/1968 | Garrahan | 307—322 X |

OTHER REFERENCES

Amodei et al., "Tunnel Diode-Transistor Inverter," RCA Technical Notes, No. 434, January 1961, sheets 1 and 2.

ROY LAKE, Primary Examiner

JAMES B. MULLINS, Assistant Examiner

U.S. Cl. X.R.

307—286, 322